(12) United States Patent
Yra et al.

(10) Patent No.: US 8,482,894 B2
(45) Date of Patent: Jul. 9, 2013

(54) SOURCE DRIVER CURRENT FOLD-BACK PROTECTION

(75) Inventors: Pablito B. Yra, Union City, CA (US);
Pierre Irissou, Sunnyvale, CA (US);
Mathieu Sureau, San Francisco, CA (US); David Truong, San Jose, CA (US); Russell Stevens, San Jose, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 268 days.

(21) Appl. No.: 13/053,084

(22) Filed: Mar. 21, 2011

(65) Prior Publication Data
US 2012/0242304 A1 Sep. 27, 2012

(51) Int. Cl.
*H02H 9/08* (2006.01)
(52) U.S. Cl.
USPC ........................................ 361/93.9
(58) Field of Classification Search
USPC ........................................ 361/93.9
See application file for complete search history.

(56) References Cited

U.S. PATENT DOCUMENTS

| 7,672,106 | B1 | 3/2010 | Sullivan |
| 7,940,505 | B1 * | 5/2011 | Sadate et al. ................. 361/93.8 |
| 2011/0169469 | A1 * | 7/2011 | Li et al. ......................... 323/282 |

OTHER PUBLICATIONS allegromicro.com/en/products/part_numbers/2557; Protected Quad Drive with Fault Detection and Sleep Mode; Nov. 2010; pp. 1-13.
Infineon Data Sheet BTS50055-1TMC; Smart Highside High Current Power Switch; Apr. 2010; pp. 1-17.

* cited by examiner

*Primary Examiner* — Dharti Patel
(74) *Attorney, Agent, or Firm* — Weaver Austin Villeneuve & Sampson LLP

(57) ABSTRACT

A load current is limited to a safe level with a current protection logic circuit within a first selected interval after detection of a fault condition. The current protection logic circuit returns the load current to a normal level within a second selected interval after correction of the fault condition, wherein said safe level is less than one half of the normal level. The current protection logic circuit is a feature of a high side driver comprising at least two source drivers, each source driver being configured to switch an electrical load to a common power supply, and comprising a respective current protection logic circuit.

31 Claims, 5 Drawing Sheets

SOURCE DRIVER CURRENT FOLD-BACK PROTECTION

TECHNICAL FIELD

This invention relates generally to an electrical power supply controller and, in particular, to a source driver having current fold-back protection.

BACKGROUND

High side drivers are widely used to control grounded electrical loads in, for example aerospace, automotive and industrial applications. High side drivers have been applied to driving the high side of power On/Off relays, RF switches, solid state relays and switches, and other grounded loads from a positive direct current (DC) voltage source. The loads may be characterized as resistive, inductive, capacitive, or a mix thereof. A high side driver may, for example, include one or more source drivers that provide switching (and, if desired, other control functions) between the high (positive) side of a power source, and a first terminal of an electrical load being switched, where a second terminal of the electrical load is connected to a common power circuit ground.

A fault in the electrical load ("load fault"), such as a short circuit condition or a partial short, may create a high current condition that damages the load and/or nearby components and equipment. The high current condition also has the potential to damage a source driver, and/or the high side driver. Known techniques such as fuses and circuit breakers provide reliable protection, but are unattractive for many applications where self-resetting of the high side driver and/or load is desirable.

Current limiting techniques have been employed in laboratory power supplies as well as commercially available integrated circuits such as INFINEON Smart Highside High Current Power Switch Reference BTS50055-1TMC, and ALLEGRO Protected Quad Driver with Fault Detection and Sleep Mode Reference A2557. The above-mentioned devices provide for progressive current limitation, wherein an output voltage of a high side driver is progressively limited in the event of a partial or total short, so as to assure that load currents do not exceed a specified level. An example of progressive current limitation, as the term is used herein, is illustrated in FIG. 1. For such a progressive current limitation scheme, a source driver output voltage is normally regulated, within a prescribed tolerance, in the absence of a fault condition, over a range of normal load impedances, as illustrated in FIG. 1, "pre-fault period" and "post-fault period". During the existence of a fault condition (i.e., the load impedance drops below a specified limit), the source driver output voltage is progressively decreased, so as to prevent load current from exceeding a specified level, as illustrated in FIG. 1, "fault condition".

SUMMARY OF INVENTION

The present inventors have recognized that progressive current limitation of the prior art results in a requirement for undesirably oversized output transistors. Oversizing is required because the output transistors must have sufficient safe operation area (SOA) relative to the large power dissipation which occurs during an overload. The present inventors have developed a source driver with an improved current foldback transfer function. The improvement may be advantageously employed in a high side driver to achieve substantially smaller packaging than permitted by the prior art.

In an embodiment, the current foldback transfer function, once a load fault condition is detected, substantially reduces, from a normal level, an output stage current from the high side driver. Advantageously, the output stage current is reduced sufficiently to avoid exceeding the safe operating area (SOA) of nominally sized output transistors. Accordingly, the output stage may operate as a current source having current sufficiently low to avoid any damage or progressive degradation to the load, source driver, or high side driver, but sufficiently large for the driver circuitry to re-start itself when the load fault clears. Advantageously, the driver circuitry automatically re-starts (returns load current to a normal level) within a pre-determined interval of time after sensing removal of the load fault condition.

In an embodiment, a high side driver has at least two source drivers, each source driver being configured to switch an electrical load to a common power supply. Each source driver includes a current protection logic circuit configured to automatically (i) limit load current to a safe level, within a first selected interval after detection of a fault condition; and (ii) return the load current to a normal level within a second selected interval after correction of the fault condition, the safe level being less than one half of the normal level.

In a further embodiment, the safe level is less than five percent of the normal level.

In another embodiment, the first selected interval is less than 100 micro seconds and the second selected interval is less than 10 milliseconds. In a still further embodiment, the first selected interval is approximately 10 micro seconds and the second selected interval is approximately 1 millisecond.

In an embodiment, the high side driver incorporates temperature protection. In a further embodiment, at least one source driver incorporates temperature protection.

In another embodiment, at least one source driver comprises an output stage, and the current protection logic circuit comprises at least one comparator that monitors an operating condition of the output stage. In a further embodiment, the current protection logic circuit is configured to automatically return load current to the normal level based upon an output signal of the at least one comparator.

In a still further embodiment, the current protection logic circuit is bypassed or disabled during a transient period, the transient period being associated with an initial load activation period or with a load reactivation period, following correction of a load fault.

In an embodiment, the fault condition consists of at least one of a short in the electrical load and an over current condition in the electrical load.

In another embodiment, the high side driver comprises at least eight source drivers, each source driver having a 750 mA continuous duty rating.

In an embodiment, an application specific integrated circuit (ASIC) includes a high side driver comprising at least two source drivers, each source driver being configured to switch an electrical load to a common power supply. Each source driver includes a current protection logic circuit configured to automatically (i) limit load current to a safe level, within a first selected interval after detection of a fault condition; and (ii) return the load current to a normal level within a second selected interval after correction of the fault condition, wherein said safe level is less than one half of the normal level.

In an embodiment, a source driver is disposed between an electrical load and a power supply, and includes a current protection logic circuit configured to automatically (i) limit load current to a safe level, within a first selected interval after detection of a fault condition; and (ii) return the load current to a normal level within a second selected interval after correction of the fault condition, wherein said safe level is less than one half of the normal level.

In a further embodiment, a load current is limited, with a current protection logic circuit, to a safe level, within a first selected interval after detection of a fault condition, and the load current is returned, with the current protection logic circuit, to a normal level within a second selected interval after correction of the fault condition, wherein the safe level is less than one half of the normal level. The current protection logic circuit is a feature of a high side driver comprising at least two source drivers, each source driver being configured to switch an electrical load to a common power supply, and comprising a respective current protection logic circuit.

BRIEF DESCRIPTION OF THE DRAWINGS

Features of the invention are more fully disclosed in the following detailed description of the preferred embodiments, reference being had to the accompanying drawings, in which.

Figure 1:
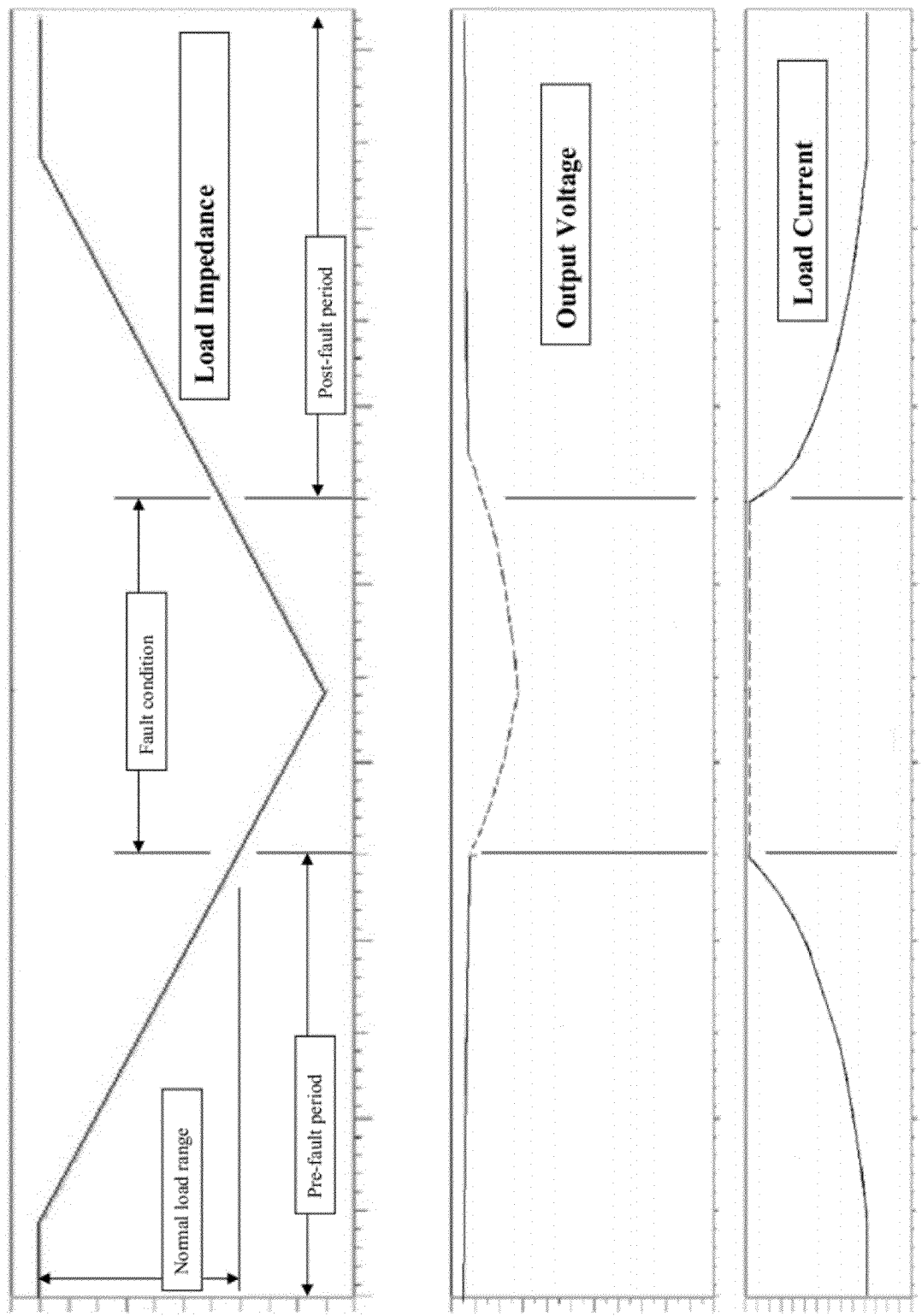
FIG. 1 illustrates characteristics of a progressive current limitation circuit of the prior art.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. Furthermore, "connected" or "coupled" as used herein may include wirelessly connected or coupled. It will be understood that although the terms "first" and "second" are used herein to describe various elements, these elements should not be limited by these terms. These terms are used only to distinguish one element from another element. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

According to an embodiment of the presently disclosed techniques, a source driver may be disposed so as to control a power supply for an electrical load. The source driver may be monitored and/or controlled by a current protection logic circuit providing for current foldback upon detection of a fault condition. The current protection logic circuit may be configured to automatically (i) limit load current to a safe level, within a first selected interval after detection of a fault condition; and (ii) return load current to a normal level within a second selected interval after removal of the short condition. Advantageously, the safe level may be less than 5% of the normal level.

Figure 2:
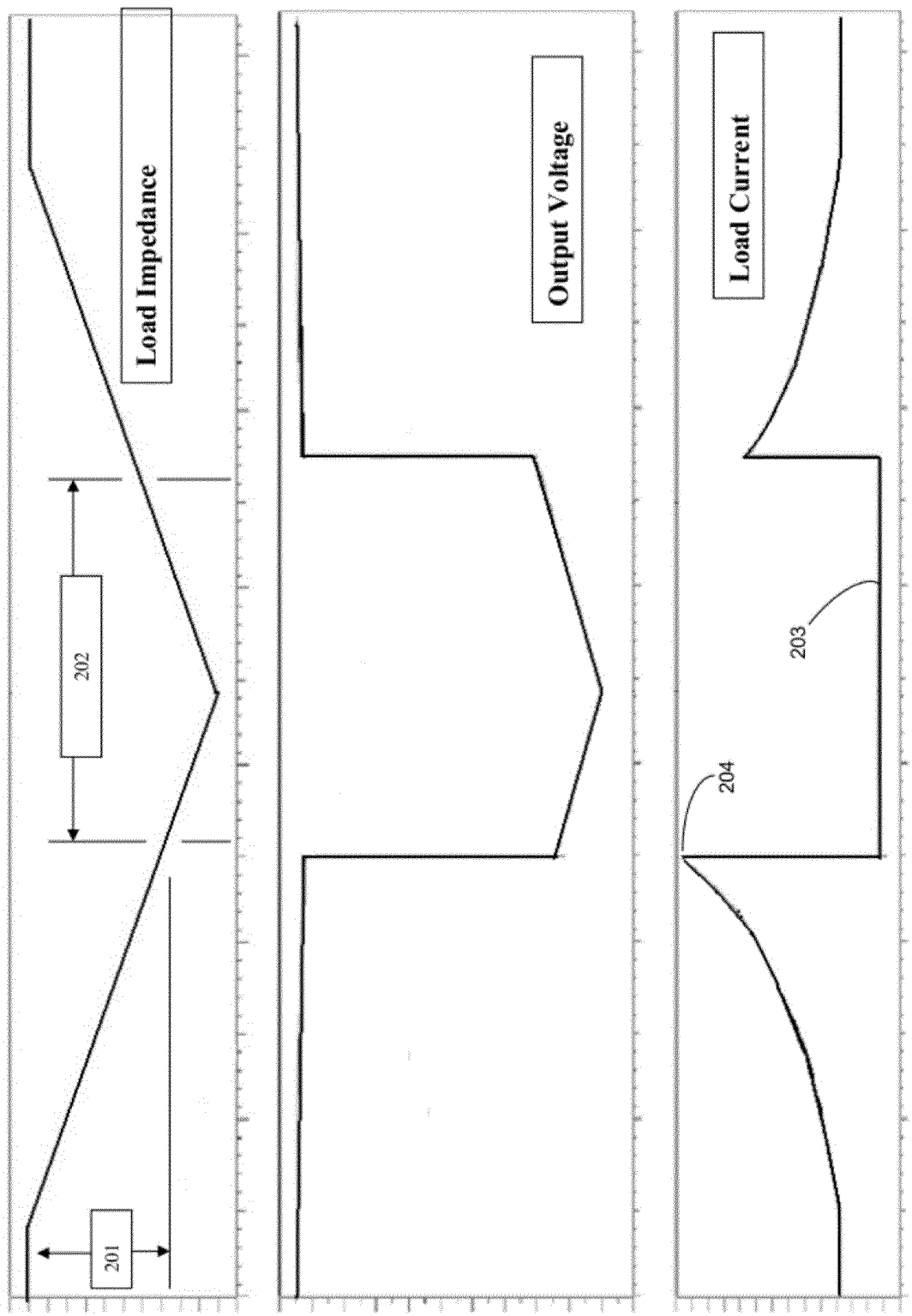
FIG. 2 illustrates characteristics of an example of a current fold back protection according to an embodiment.

For example, referring now to FIG. 2, a source driver output voltage is normally regulated, within a prescribed tolerance, in the absence of a fault condition, over a normal load impedance range 201. During the duration 202 of a fault condition (i.e., during a period in which the load impedance is below a specified limit), the source driver may limit load current to a safe level 203 (that may be considered as a "trickle current"). Safe level 203 may be substantially lower than a specified maximum load current 204. Advantageously, the source driver, promptly after detection of the load fault condition, may automatically limit the load current to safe level 203 that is less than 5% of the normal level. In an embodiment, the source driver may start to limit the load current within a first selected interval after detection of a fault condition that may be less than 100 microseconds. Advantageously, the first selected interval may be approximately five microseconds.

In an embodiment, the safe level of current is selected as being sufficient to enable the source driver to sense the load impedance. Advantageously, safe level 203 may be selected as being barely sufficient to enable the source driver to sense the load impedance. As a result, the source driver may sense correction of the load fault condition (i.e., a return of the load impedance returns to within normal load impedance range 201). In an embodiment, promptly after detection of correction of the load fault condition, the source driver may automatically resume regulation of the source driver output voltage. In an embodiment, the source driver may cease limiting the load current, after detecting correction of the fault condition, within a second selected interval that may be less than 10 milliseconds. Advantageously, the second selected interval may be approximately 1 millisecond.

Figure 3:
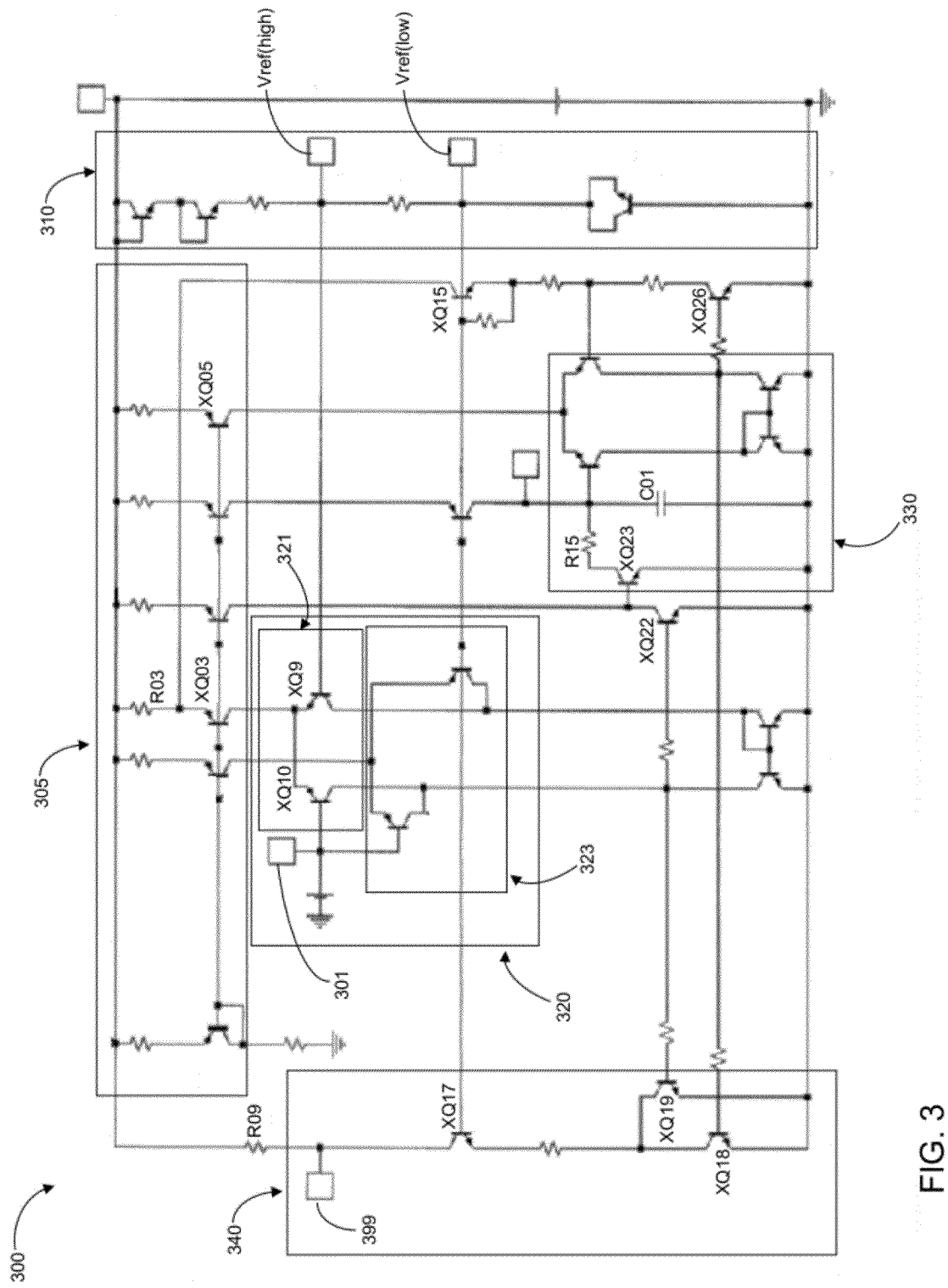
FIG. 3 illustrates an example of a current protection circuit.

In an embodiment, a current protection logic may be provided for one or more source drivers of a high side driver in which one terminal of the load is grounded whereas the other terminal is pulled "high" by a power switch connected to a positive supply such as a battery or vehicle power bus. Referring now to FIG. 3, an example of a current protection logic circuit 300 for a source driver is illustrated. Current protection logic circuit 300 may include, as illustrated in the example embodiment, a bias current generator module 305, a voltage reference generator module 310, a comparator module 320, a delay circuit module 330, and a power stage disable module 340. Comparator module 320 may consist of an upper comparator 321 and a lower comparator 323, having a common input 301. Common input 301 may be a voltage signal that is representative of an operating condition of the output stage of the source driver. In the illustrated embodiment, voltage reference generator module 310 may be configured to generate reference voltages Vref(high) and Vref(low). Under the conditions described hereinbelow, power stage disable module 340 may produce an output signal 399 which is operable to inhibit source driver output current.

Referring still to FIG. 3, when the source driver is operating normally (i.e., in the absence of a load fault condition), the voltage signal at common input 301 may be higher than the respective reference voltages Vref(high) and Vref(low). When the voltage signal at common input 301 is higher than the respective reference voltages, Vref(high) and Vref(low), current protection logic circuit 300 may ensure that there is no current in XQ17 and, therefore, no voltage developed across R09. As a result, output signal 399 of power stage disable module 340 may be set in an OFF condition. As a result of output signal 399 being OFF, the source driver is not impeded from providing a normally regulated output voltage.

Upon an occurrence of a fault condition, such as a current overload or a short-circuit, the voltage signal at common input 301 may be lower than the respective reference voltages Vref(high) and Vref(low). Current protection logic circuit 300 may switch output signal 399 to ON, as a result of which the source driver may be impeded from providing the normally regulated output voltage, and instead will limit load current to a safe level. For example, in an embodiment, when common input 301 is determined by comparator module 320 to be lower than the respective reference voltages Vref (high) and Vref(low), XQ19 may be turned ON. Consequently, there may be current in XQ17 and a voltage developed across R09. As a result, output signal 399 of power stage disable module 340 may be set in an ON condition. As a result of output signal 399 being ON, the source driver may be impeded from providing a normally regulated output voltage.

Advantageously, when common input 301 is determined by comparator module 320 to be lower than the respective reference voltages Vref(high) and Vref(low), XQ22 may also be turned ON. Consequently, capacitor C01, within delay circuit module 330, may be enabled to charge during an interval determined by the capacitance of C01 and by a magnitude of output current provided by XQ05. In an embodiment, capacitance of C01 and output current of XQ05 may be, respectively, 10 pF and 1 uA, resulting in a charge interval of approximately 60 uS. Upon charging of capacitor C01, delay circuit module 330 may change output states, with the result that, first, XQ18, within power stage disable module 340, is turned ON. As a result, the output signal 399 of power stage disable module 340 may remain in an ON condition, and the source driver may be impeded from providing a normally regulated output voltage, irrespective of the state of XQ19.

As an additional result of delay circuit module 330 changing output states, XQ26 may be turned ON. Consequently, a current may be generated in XQ15, which in turn develops a voltage across R03, which results in turning XQ03, within bias current generator module 305, OFF. When XQ03 is turned OFF, no current is provided to XQ09 and XQ10, which together form a differential pair within upper comparator 321. Thus, upper comparator 321 may be totally disabled. As a result, the voltage signal at common input 301 may only be monitored by lower comparator 323.

Current protection logic circuit 300 may remain in the condition described above for as long as the fault condition persists. While current protection logic circuit 300 is thus configured, load current from the source driver may be limited to a safe level, and the source drive itself may operate in a "current fold-back" mode, wherein its output stage behaves like a current source and only delivers a current which is (i) low enough to be sustained indefinitely without any short-term or long-term degradation or damage to the load, source driver, or high side driver, and, (ii) high enough to allow current protection logic circuit 300 to sense whether the fault condition has been corrected. Advantageously, the source driver may continuously deliver load current, limited to the safe level, for the purpose of enabling current protection logic circuit 300 to sense whether the fault has cleared or not.

Referring still to FIG. 3, lower comparator 321 may continue to monitor the voltage signal at common input 301. Whether the fault condition is a "hard" or a "soft" short-circuit condition, the voltage signal at common input 301 may be lower than Vref(low), in which case current protection logic circuit 300 may hold the output signal 399 of power stage disable circuit module 340 in the ON condition and the source driver will remain in the current fold-back mode.

Upon correction of the fault condition, such as, for example, in case of a short-circuit which clears or a load which returns to normal after a temporary overload condition, the voltage signal at common input 301 may become larger than Vref(low). In an embodiment, such occurrence immediately results in lower comparator 323 changing state. As a result, XQ19, within power stage disable module 340, and XQ22 may be turned OFF, and XQ23, within delay circuit module 330, may be turned ON. As a result of XQ23 being turned ON, C01 may discharge through R015. When C01 is discharged, delay circuit module 330 may change state with the result that XQ26 and XQ18 may each be turned OFF. Turning Off XQ26 restores normal operation of upper comparator 321. Turning XQ18 OFF, since XQ19 is already OFF, results in power stage disable module 340 setting output signal 399 in an OFF condition. As a result, the source drive will no longer be impeded from providing a normally regulated output voltage. In an embodiment, the source driver may return the load current to a normal level within a selected interval after correction of the fault condition that is less than 10 milliseconds. Advantageously, in order to prevent dangerous cycling on marginal load conditions, a built-in delay may be provided which will cause the selected interval to be at least 100 microseconds. Advantageously, the selected interval may be approximately one millisecond.

In an embodiment, current protection logic circuit 300 may be bypassed or disabled, during a period associated with initial load activation. Ordinarily, a control logic input of the high side driver may be pulled high, which in turn causes the source driver to turn ON. In an embodiment, during a brief initial turn-on phase transient, current protection logic circuit 300 may be disabled. For example, during a transient "blanking" time period of approximately 10 microseconds, current protection logic circuit 300 may be disabled in order to accommodate normal current spikes at turn on that may result from load capacitances. Advantageously, when lower comparator 323 allows the source driver to return to a normal operation, following correction of load fault condition, an approximately 10 microsecond "blanking" may also be provided.

In an embodiment, a temperature protection circuit may be provided that is configured to disable the source driver should a junction temperature exceed a specified limit.

Figure 4:
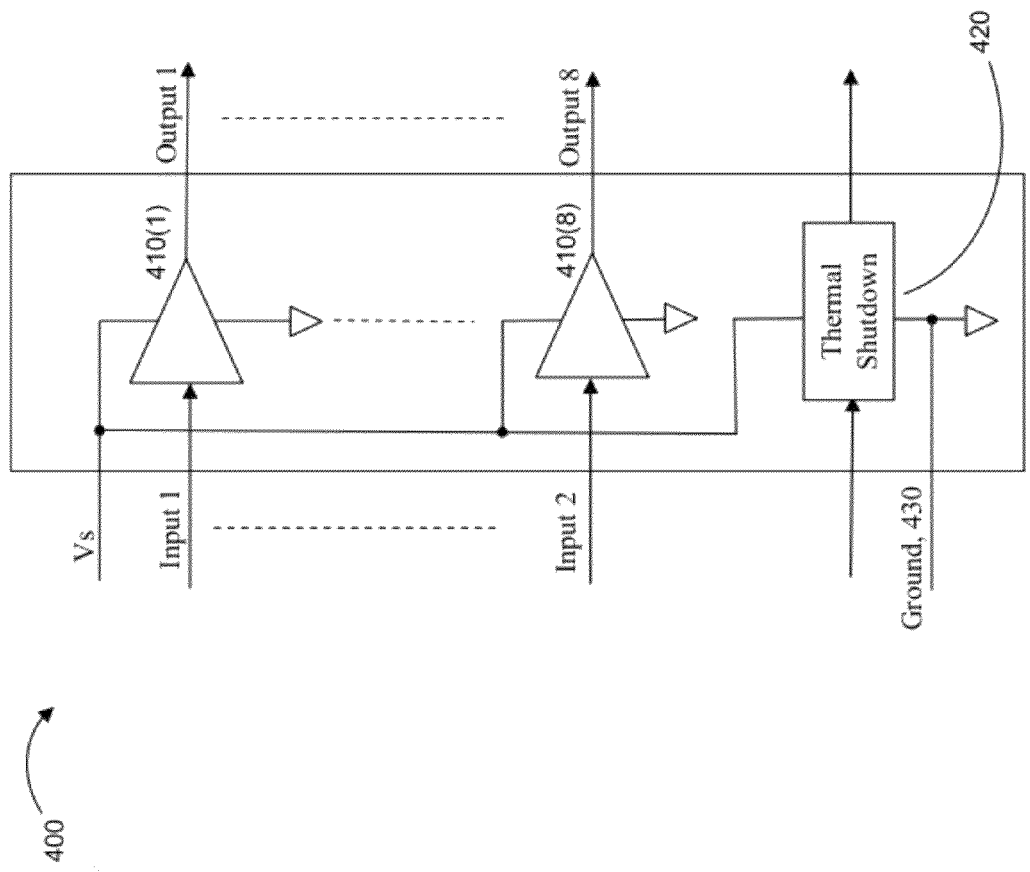
FIG. 4 illustrates an example of a high side driver having current protection.

In an embodiment, referring now to FIG. 4, multiple source drivers may be configured, for example, in parallel, as part of a high side driver. High side driver 400, for example, may consist of eight source drivers 410, having a common thermal protection circuit 420, and ground 430. In an embodiment, each source driver may have a 750 mA continuous duty rating. Advantageously, each source driver, the high side driver and/or the current protection logic circuit may be implemented in an integrated circuit, more particularly, for example, as an application specific integrated circuit (ASIC).

Figure 5:
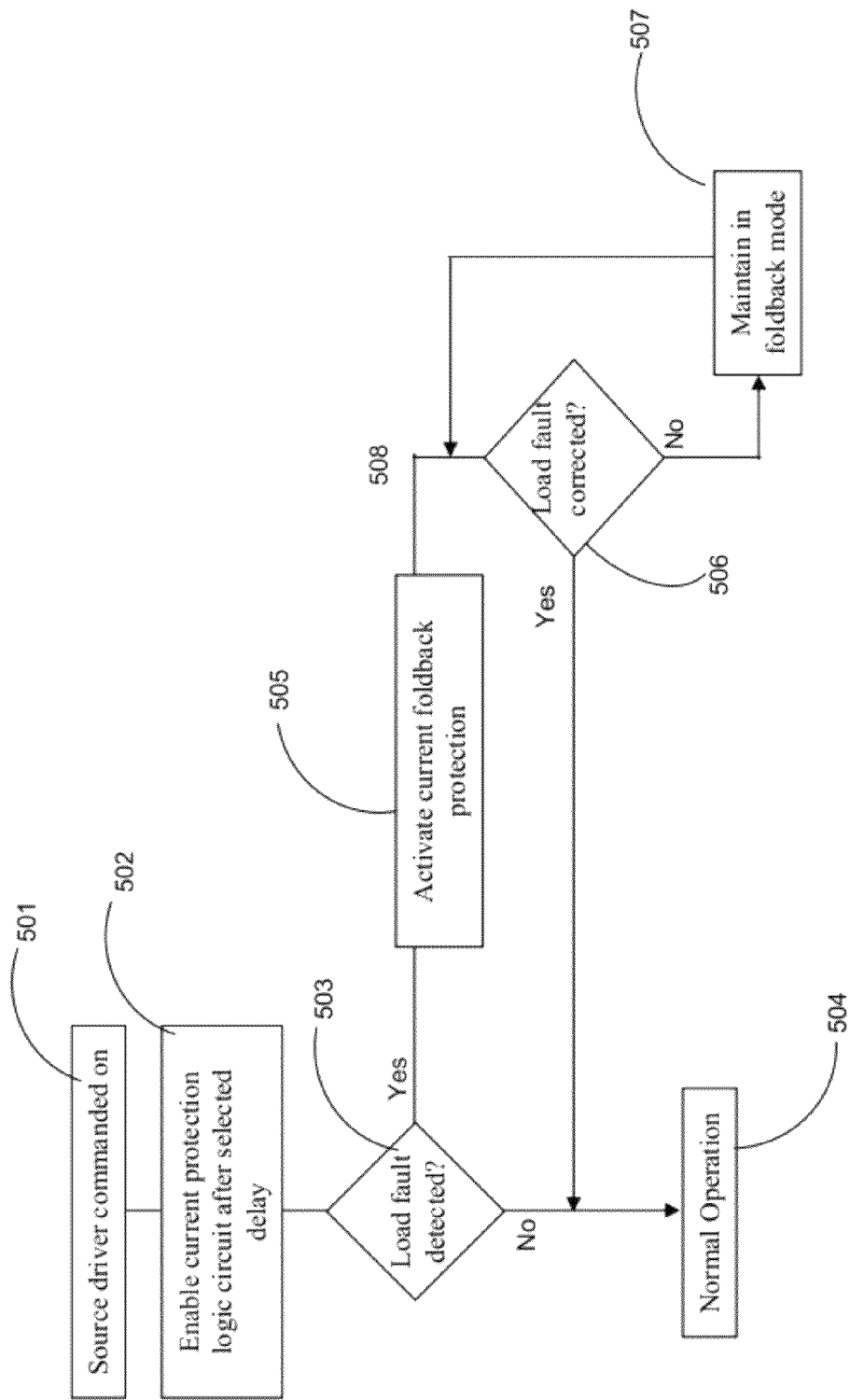
FIG. 5 illustrates a method of providing current protection, according to an embodiment.

Referring now to FIG. 5, in an embodiment, at step 501, a source driver may be commanded on. In an embodiment, at step 502, a current protection logic circuit is enabled only after a selected delay interval expires. Advantageously, once enabled, the current protection logic circuit may continuously monitor, step 503, for the occurrence of a load fault condition.

In the absence of detecting a load fault condition, normal source driver operation proceeds, step 504.

Promptly after detecting the existence of a load fault condition, the current protection logic circuit may activate current foldback protection, step 505. In an embodiment, the current foldback protection may be activated within 5-100 microseconds after detecting the existence of a load fault condition.

Once the current foldback protection has been activated, the current protection logic circuit may continuously monitor, step 506, for correction of the load fault condition. In the absence of detecting correction of the load fault condition, current foldback mode operation of the source driver is maintained, step 507.

Promptly after detecting the correction of the load fault condition, the current protection logic circuit may deactivate current foldback protection and return to normal operation, step 504. Advantageously, the current foldback protection may be deactivated within 1-10 milliseconds after detecting the correction of the load fault condition.

Thus, current fold-back protection techniques for source drivers have been disclosed, wherein a current protection logic circuit automatically limits load current to a safe level, within a first selected interval after detection of a fault condition; and automatically returns the load current to a normal level within a second selected interval after correction of the fault condition.

The various illustrative logics, logical blocks, modules, circuits and algorithm steps described in connection with the implementations disclosed herein may be implemented as electronic hardware, computer software, or combinations of both. The hardware and data processing apparatus used to implement the various illustrative logics, logical blocks, modules and circuits described in connection with the aspects disclosed herein may be implemented or performed with a general purpose single- or multi-chip processor, a digital signal processor (DSP), a field programmable gate array (FPGA) or other programmable logic device, discrete gate or transistor logic, discrete hardware components, or any combination thereof designed to perform the functions described herein. Advantageously, the circuit protection logic, source driver, and/or high side driver may be implemented in an application specific integrated circuit (ASIC).

A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. An apparatus, comprising:
    a high side driver comprising at least two source drivers, each source driver being configured to switch an electrical load to a common power supply, the electrical load exhibiting a load impedance, and at least one source driver comprising:
        a current protection logic circuit configured to automatically (i) limit load current to a safe level, within a first selected interval after detection of a fault condition; and (ii) return the load current to a normal level within a second selected interval after correction of the fault condition, wherein said safe level is between a first level that is less than one half of the normal level and a second level that is barely sufficient to enable the source driver to sense the load impedance.

2. The apparatus of claim 1, wherein, the safe level is less than five percent of the normal level.

3. The apparatus of claim 1, wherein, the first selected interval is less than 100 micro seconds and the second selected interval is less than 10 milliseconds.

4. The apparatus of claim 1, wherein, the first selected interval is approximately 10micro seconds and the second selected interval is approximately 1 millisecond.

5. The apparatus of claim 1, wherein the high side driver incorporates temperature protection.

6. The apparatus of claim 1, wherein at least one source driver incorporates temperature protection.

7. The apparatus of claim 1, wherein at least one source driver comprises an output stage, and the current protection logic circuit comprises at least one comparator that monitors an operating condition of the output stage.

8. The apparatus of claim 7, wherein the current protection logic circuit is configured to automatically return load current to the normal level based upon an output signal of the at least one comparator.

9. The apparatus of claim 1, wherein the current protection logic circuit is bypassed or disabled during a transient period, the transient period being associated with an initial load activation period or with a load reactivation period, following correction of a load fault.

10. The apparatus of claim 1, wherein the fault condition consists of at least one of a short in the electrical load and an over current condition in the electrical load.

11. The apparatus of claim 1, wherein the high side driver comprises at least eight source drivers, each source driver having a 750 mA continuous duty rating.

12. An application specific integrated circuit (ASIC), comprising:
    a high side driver comprising at least two source drivers, each source driver being configured to switch an electrical load to a common power supply, the electrical load exhibiting a load impedance, and at least one source driver comprising:
        a current protection logic circuit configured to automatically (i) limit load current to a safe level, within a first selected interval after detection of a fault condition; and (ii) return the load current to a normal level within a second selected interval after correction of the fault condition, wherein said safe level is between a first level that is less than one half of the normal level and a second level that is barely sufficient to enable the source driver to sense the load impedance.

13. The ASIC of claim 12, wherein the safe level is less than five percent of the normal level.

14. The ASIC of claim 12, wherein the first selected interval is less than 100 micro seconds and the second selected interval is less than 10 milliseconds and the second selected interval is approximately 1 millisecond.

15. The ASIC of claim 12, wherein at least one of the high side driver and a source driver incorporates temperature protection.

16. The ASIC of claim 12, wherein at least one source driver comprises an output stage, and the current protection logic circuit comprises at least one comparator that monitors an operating condition of the output stage.

17. The ASIC of claim 16, wherein the current protection logic circuit is configured to automatically return load current to the normal level based upon an output signal of the at least one comparator.

18. The ASIC of claim 12, wherein the current protection logic circuit is bypassed or disabled during a transient period, the transient period being associated with an initial load activation period or with a load reactivation period, following correction of a load fault.

19. The ASIC of claim 12, wherein the fault condition consists of at least one of a short in the electrical load and an over current condition in the electrical load.

20. The ASIC of claim 12, wherein the high side driver comprises at least eight source drivers, each source driver having a 750 mA continuous duty rating.

21. A source driver disposed between an electrical load and a power supply, the electrical load exhibiting a load impedance, the source driver comprising:
current protection logic circuit configured to automatically (i) limit load current to a safe level, within a first selected interval after detection of a fault condition; and (ii) return the load current to a normal level within a second selected interval after correction of the fault condition, wherein said safe level is between a first level that is less than one half of the normal level and a second level that is barely sufficient to enable the source driver to sense the load impedance.

22. The source driver of claim 21, wherein, the safe level is less than five percent of the normal level.

23. The source driver of claim 21, wherein the first selected interval is less than 100 micro seconds and the second selected interval is less than 10 milliseconds and the second selected interval is approximately 1 millisecond.

24. The source driver of claim 21, wherein at least one of the high side driver and a source driver incorporates temperature protection.

25. The source driver of claim 21, wherein the source driver comprises an output stage, and the current protection logic circuit comprises at least one comparator that monitors an operating condition of the output stage.

26. The source driver of claim 25, wherein the current protection logic circuit is configured to automatically return load current to the normal level based upon an output signal of the at least one comparator.

27. The source driver of claim 21, wherein the current protection logic circuit is bypassed or disabled during a transient period, the transient period being associated with an initial load activation period or with a load reactivation period, following correction of a load fault.

28. The source driver of claim 21, wherein the fault condition consists of at least one of a short in the electrical load and an over current condition in the electrical load.

29. The source driver of claim 21, wherein the high side driver comprises at least eight source drivers, each source driver having a 750 mA continuous duty rating.

30. A method comprising:
limiting, with a current protection logic circuit, a load current to a safe level, within a first selected interval after detection of a fault condition, and
returning, with said current protection logic circuit, the load current to a normal level within a second selected interval after correction of the fault condition; wherein,:
the current protection logic circuit is a feature of a high side driver comprising at least two source drivers, each source driver being configured to switch an electrical load to a common power supply, and comprising a respective current protection logic circuit, the electrical load exhibiting a load impedance; and
the safe level is between a first level that is less than one half of the normal level and a second level that is barely sufficient to enable the source driver to sense the load impedance.

31. A non-transitory computer readable medium wherein computer instructions are stored, the instructions operable to cause a computer to:
limit a load current of a source driver to a safe level, within a first selected interval after detection of a fault condition, and
return the load current to a normal level within a second selected interval after correction of the fault condition; wherein:
the source driver is configured to switch an electrical load to a common power supply, the electrical load exhibiting a load impedance; and
the safe level is between a first level that is less than one half of the normal level and a second level that is barely sufficient to enable the source driver to sense the load impedance.

* * * * *